United States Patent
Shen et al.

(10) Patent No.: US 11,502,015 B2
(45) Date of Patent: Nov. 15, 2022

(54) SEMICONDUCTOR PACKAGE AND MANUFACTURING METHOD THEREOF

(71) Applicant: Taiwan Semiconductor Manufacturing Co., Ltd., Hsinchu (TW)

(72) Inventors: Wen-Wei Shen, Hsinchu (TW); Sung-Hui Huang, Yilan County (TW); Shang-Yun Hou, Hsinchu (TW); Kuan-Yu Huang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 69 days.

(21) Appl. No.: 16/885,304

(22) Filed: May 28, 2020

(65) Prior Publication Data

US 2021/0375711 A1     Dec. 2, 2021

(51) Int. Cl.
| | |
|---|---|
| *H01L 23/31* | (2006.01) |
| *H01L 21/56* | (2006.01) |
| *H01L 23/00* | (2006.01) |
| *H01L 25/18* | (2006.01) |
| *H01L 25/00* | (2006.01) |

(Continued)

(52) U.S. Cl.
CPC ........ *H01L 23/3192* (2013.01); *H01L 21/563* (2013.01); *H01L 23/3185* (2013.01); *H01L 24/16* (2013.01); *H01L 25/18* (2013.01); *H01L 25/50* (2013.01); *H01L 21/268* (2013.01); *H01L 23/293* (2013.01); *H01L 2224/16145* (2013.01)

(58) Field of Classification Search
None
See application file for complete search history.

(56) References Cited

U.S. PATENT DOCUMENTS

| | | | |
|---|---|---|---|
| 6,372,544 B1 | 4/2002 | Halderman et al. | |
| 8,993,380 B2 | 3/2015 | Hou et al. | |

(Continued)

FOREIGN PATENT DOCUMENTS

| | | | |
|---|---|---|---|
| CN | 110676231 | | 1/2020 |
| CN | 110676231 A | * | 1/2020 |
| TW | 201926489 | | 7/2019 |

OTHER PUBLICATIONS

"Office Action of Taiwan Counterpart Application", dated Jul. 12, 2021, p. 1-p. 6.

*Primary Examiner* — Telly D Green
(74) *Attorney, Agent, or Firm* — JCIPRNET

(57) ABSTRACT

Semiconductor package includes interposer, dies, encapsulant. Each die includes active surface, backside surface, side surfaces. Backside surface is opposite to active surface. Side surfaces join active surface to backside surface. Encapsulant includes first material and laterally wraps dies. Dies are electrically connected to interposer and disposed side by side on interposer with respective backside surfaces facing away from interposer. At least one die includes an outer corner. A rounded corner structure is formed at the outer corner. The rounded corner structure includes second material different from first material. The outer corner is formed by backside surface and a pair of adjacent side surfaces of the at least one die. The side surfaces of the pair have a common first edge. Each side surface of the pair does not face other dies and has a second edge in common with backside surface of the at least one die.

20 Claims, 18 Drawing Sheets

(51) Int. Cl.
    *H01L 21/268*     (2006.01)
    *H01L 23/29*     (2006.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Ku et al. |
| 9,666,502 B2 | 5/2017 | Chen et al. |
| 9,735,131 B2 | 8/2017 | Su et al. |
| 11,024,616 B2 * | 6/2021 | Chen .................. H01L 23/3128 |
| 2012/0119353 A1 | 5/2012 | Gaynes et al. |
| 2015/0255361 A1 * | 9/2015 | Lee .................. H01L 23/49816 438/118 |
| 2018/0130749 A1 * | 5/2018 | Tsai ...................... H01L 21/561 |
| 2019/0172791 A1 * | 6/2019 | Kawabata ......... H01L 23/49805 |
| 2020/0111729 A1 | 4/2020 | Pan et al. |
| 2020/0365571 A1 * | 11/2020 | Chen .................. H01L 23/3128 |
| 2021/0225776 A1 * | 7/2021 | Wu ...................... H01L 25/165 |

\* cited by examiner

SEMICONDUCTOR PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
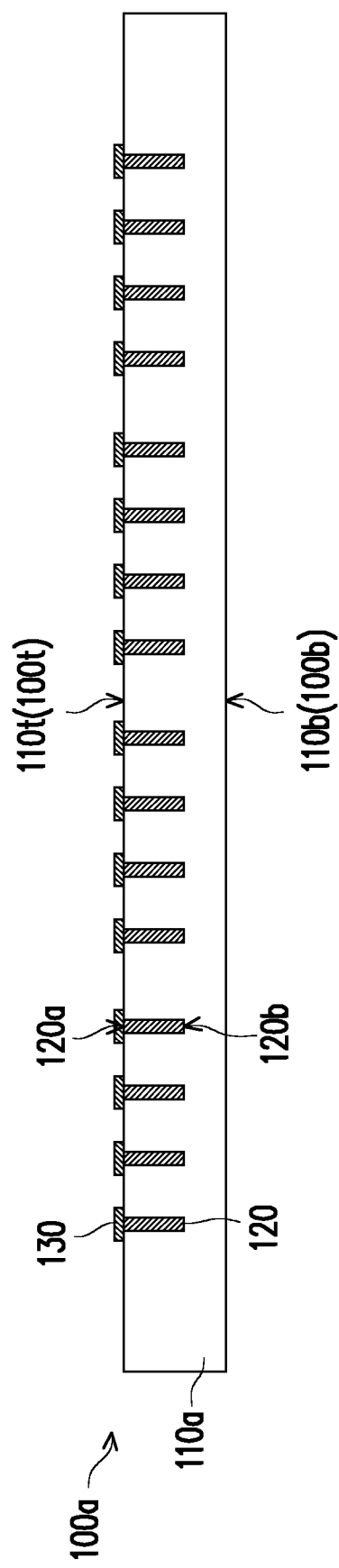
FIG. 1A to FIG. 1K are schematic cross-sectional views illustrating a manufacturing process of a semiconductor package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a manufacturing process of a semiconductor package 10 and a semiconductor device 15 in accordance with some embodiments of the disclosure. Referring to FIG. 1A, an interposer 100a is provided. In some embodiments, the interposer 100a includes a semiconductor substrate 110a, through semiconductor vias (TSVs) 120 and contact pads 130. In some embodiments, the interposer 100a includes a silicon wafer. In some embodiments, the semiconductor substrate 110a may be made of semiconductor materials, such as semiconductor materials of the groups III-V of the periodic table. In some embodiments, the semiconductor substrate 110a includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 110a includes active components (e.g., transistors or the like) and optionally passive components (e.g., resistors, capacitors, inductors, or the like) formed therein.

In some embodiments, as illustrated in FIG. 1A, the TSVs 120 are formed in the semiconductor substrate 110a, and the contact pads 130 are formed on the semiconductor substrate 110a in correspondence of the TSVs 120. In some embodiments, the contact pads 130 partially extend on the top surface 110t of the semiconductor substrate 110a. In some embodiments, the top surface 110t of the semiconductor substrate 110a on which the contact pads 130 are formed is considered a top surface 100t of the interposer 100a. In some embodiments, a contact pad 130 is formed on an end 120a of a TSV 120, and the other end 120b of the same TSV 120 is embedded in the semiconductor substrate 110a. That is, the TSVs 120 extends from the contact pad 130 into the semiconductor substrate 110a without reaching the bottom surface 110b of the semiconductor substrate 110a (temporarily, the bottom surface 100b of the interposer 100a). It is understood that the number of TSVs 120 shown in FIG. 1A is for illustration only, and the disclosure is not limited thereto. In some embodiments, the interposer 100a may include fewer or more TSVs 120. In some embodiments, a material of the TSVs 120 and a material of the contact pads 130 independently include aluminum, titanium, copper, nickel, tungsten, and/or alloys thereof. The TSVs 120 and the contact pads 130 may be formed by, for example, electroplating, deposition, and/or photolithography and etching.

Figure 1B:
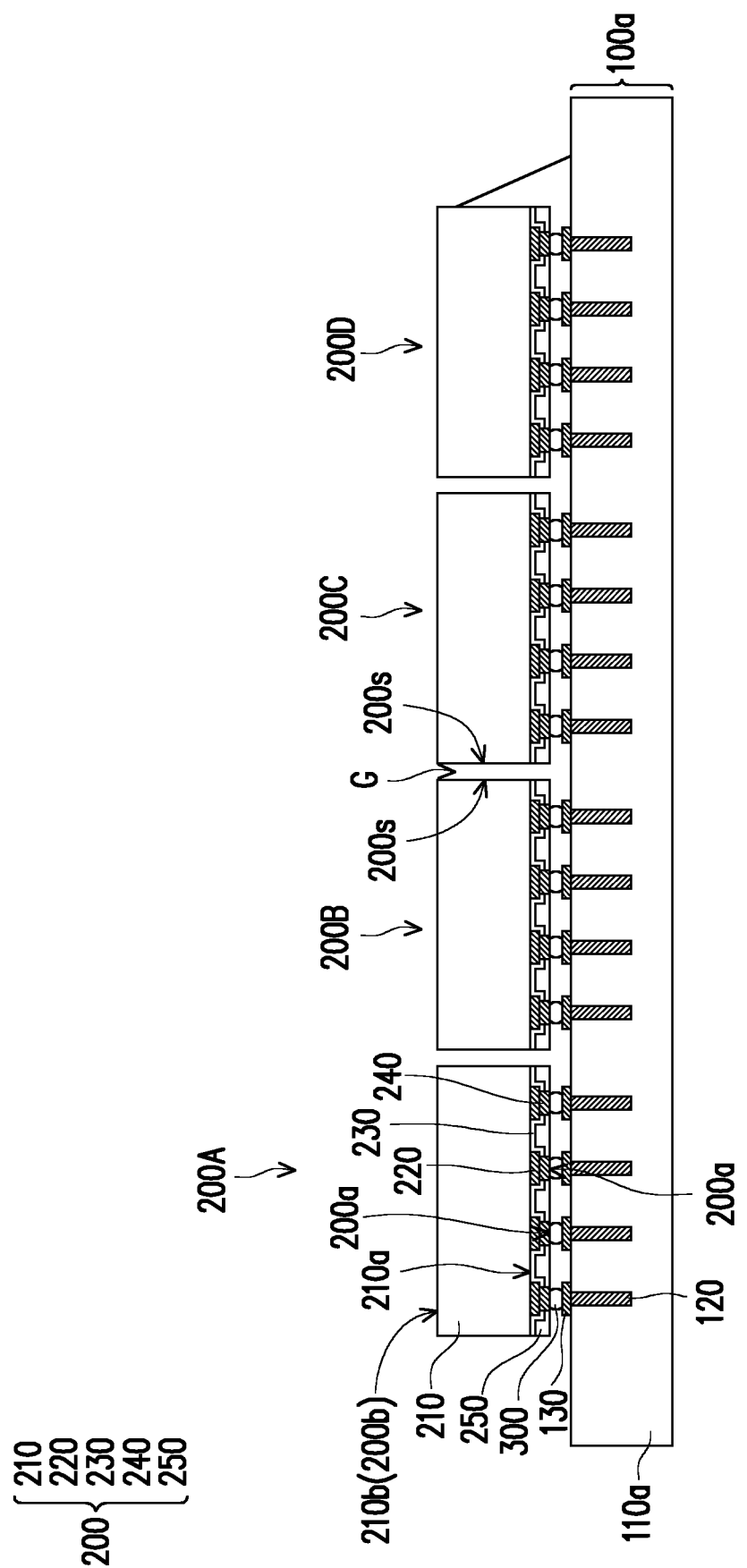

Referring to FIG. 1B, in some embodiments, semiconductor dies 200A-200D are disposed on the interposer 100a. Throughout the disclosure, when it is not necessary to differentiate between the semiconductor dies 200A-200D, the semiconductor dies 200A-200D may be collectively referred to as semiconductor dies 200. In some embodiments, each semiconductor die 200 includes a semiconductor substrate 210, contact pads 220 and a passivation layer 230. The contact pads 220 may be formed on a front surface 210a of the semiconductor substrate 210. The passivation layer 230 may cover the front surface 210a of the semiconductor substrate 210 and have a plurality of openings that exposes at least a portion of each contact pad 220. In some embodiments, a semiconductor die 200 may further include a plurality of contact posts 240 filling the openings of the passivation layer 230 and electrically connected to the contact pads 220, and a protective layer 250 surrounding the contact posts 240.

The semiconductor substrate 121 is made of a semiconductor material, similarly to what was previously discussed with reference to the semiconductor substrate 110a of the interposer 100a. In some embodiments, the semiconductor substrate 210 includes active components (e.g., transistors or the like) and optionally passive components (e.g., resistors, capacitors, inductors, or the like) formed therein. In certain embodiments, the contact pads 220 include aluminum pads, copper pads, or other suitable metal pads. In some embodiments, the passivation layer 230 may be a single layer or a multi-layered structure, including a silicon oxide layer, a silicon nitride layer, a silicon oxy-nitride layer, a dielectric layer formed by other suitable dielectric materials, or combinations thereof. In some embodiments, the material of the contact posts 240 includes copper, copper alloys, or other conductive materials, and may be formed by deposition, plating, or other suitable techniques. In some embodiments, any one of the semiconductor dies 200 disposed on the interposer 100a may present similar features as the ones just discussed. Each semiconductor die 200 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more semiconductor dies 200 may be memory dies. The disclosure is not limited by the type or number of semiconductor dies 200 disposed on the interposer 100a.

In some embodiments, the semiconductor dies 200 are bonded via connectors 300 to the interposer 100a. In some embodiments, the connectors 300 are micro-bumps installed on the contact posts 240 and sandwiched between the contact posts 240 and the contact pads 130 or the TSVs 120a (if the contact pads 130 are not formed in the interposer 100a). According to some embodiments, the semiconductor dies 200 are disposed with the active surfaces 200a (the surfaces exposing the contact posts 240 or the contact pads 220 when no contact posts 240 are included) facing the interposer 100a. Backside surfaces 200b opposite to the active surfaces 200a may be disposed further away from the interposer 100a. In some embodiments, the backside surfaces 210b of the semiconductor substrates 210 constitute the backside surfaces 200b of the corresponding semiconductor dies 200. The semiconductor dies 200A-200D may further have side surfaces 200s which join the backside surfaces 210b with the opposite front surfaces 210a.

In some embodiments, the semiconductor dies 200A-200D are disposed on the interposer in an array configuration. For example, the semiconductor dies 200A-200D may be disposed in a line, with the semiconductor dies 200A and 200D first and last in the line, and the semiconductor dies 200B, 200C disposed in between. For example, the semiconductor die 200B may be disposed between the semiconductor dies 200A and 200C, and the semiconductor die 200C may be disposed between the semiconductor dies 200B and 200D. In some embodiments, the semiconductor dies 200A and 200D include at least two side surfaces 200s sharing an edge and not facing other semiconductor dies 200A-200D. As such, the semiconductor dies 200A and 200D may be referred to as outer semiconductor dies. On the other hand, the semiconductor dies 200B and 200C do not include side surfaces 200s sharing an edge and not facing other semiconductor dies 200A-200D. As such, the semiconductor dies 200B and 200C may be referred to as inner semiconductor dies. In some embodiments, the semiconductor dies 200A-200D may have an elongated shape, and may be disposed on the interposer 100a parallel with respect to each other. In some embodiments, the semiconductor dies 200A-200D may independently present different shapes. In some embodiments, facing side surfaces 200s of the semiconductor dies 200A-200D may form tiny gaps G in between adjacent semiconductor dies 200A-200D in the array. For example, in FIG. 1B is indicated a gap G in between facing side surfaces 200s of the semiconductor dies 200B and 200C. Similar gaps G are also formed between the semiconductor dies 200A and 200B as well as between the semiconductor dies 200C and 200D. In some embodiments, a width of the gap G is considered the distance between the side surfaces 200s of the semiconductor dies forming the gap G (e.g., the semiconductor dies 200B and 200C). Side surfaces 200s are considered the surfaces joining the active surfaces 200a of the semiconductor dies 200A-200D with the corresponding backside surfaces 200b.

Figure 1C:
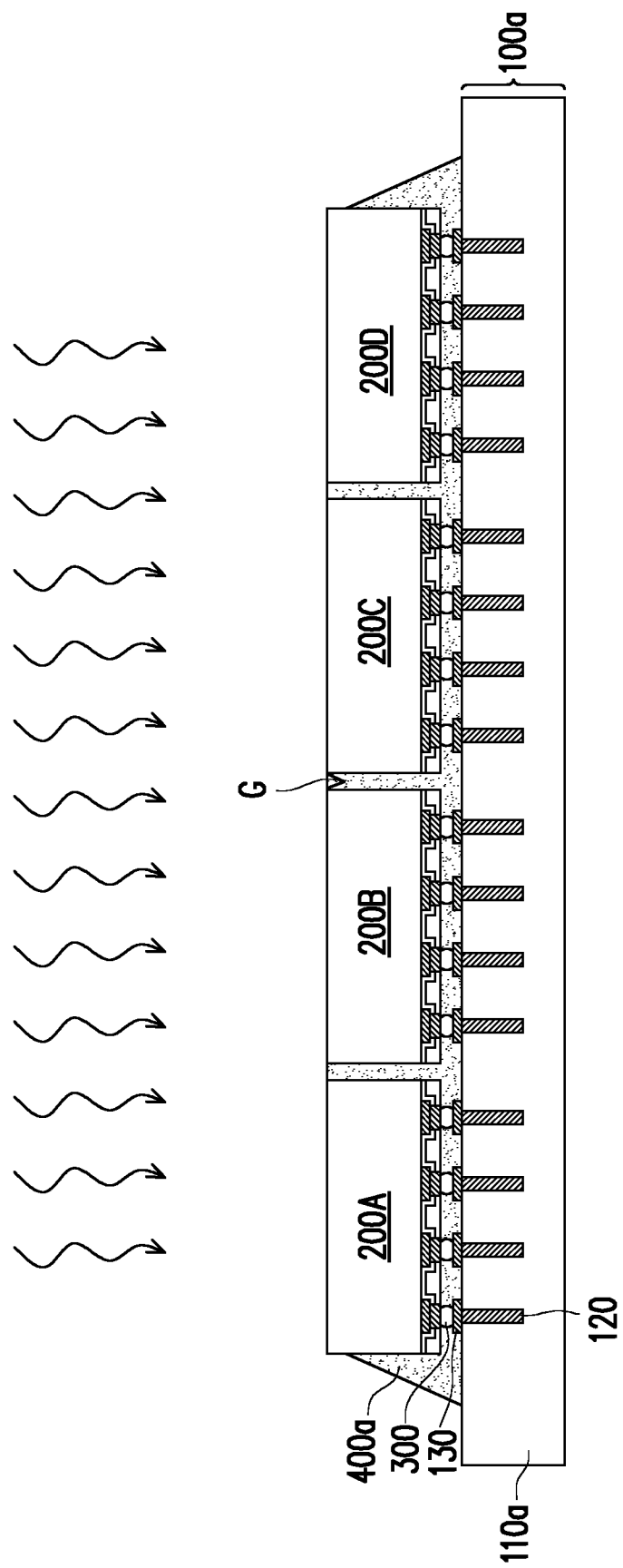
Figure 1D:
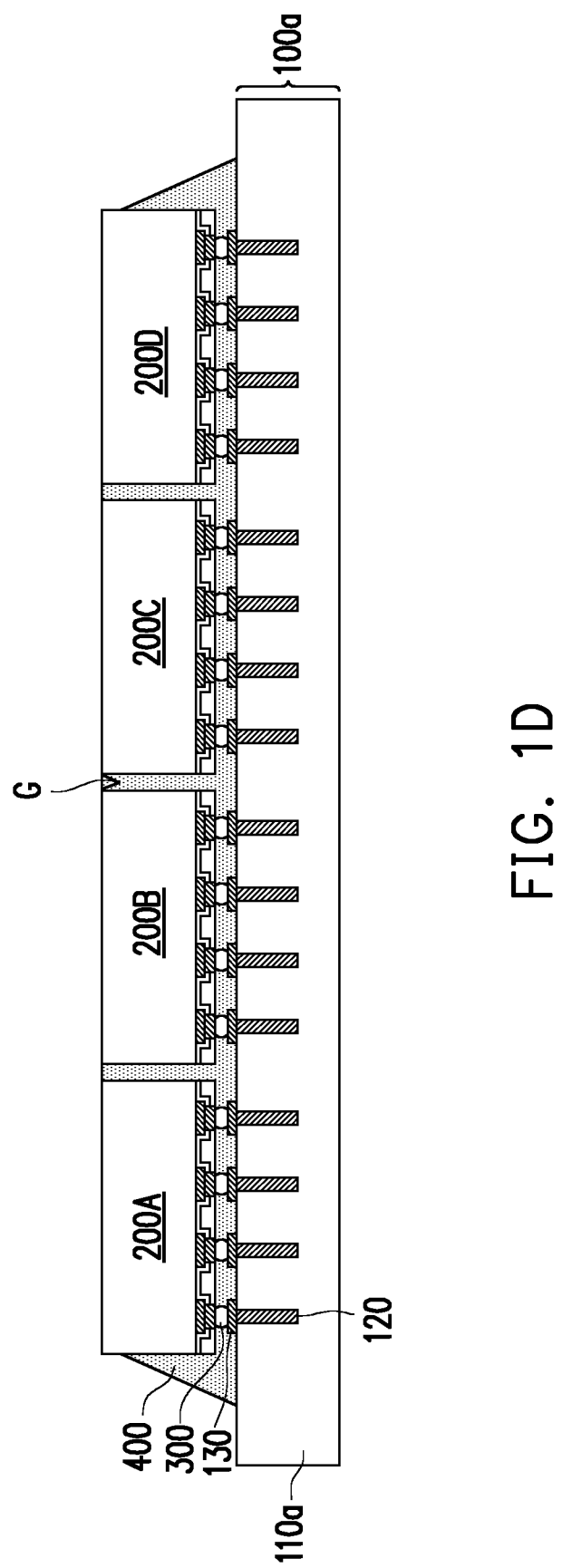

In some embodiments, referring to FIG. 1C and FIG. 1D, an underfill 400 may be disposed between the semiconductor dies 200A-200D and the interposer 100a to protect the connectors 300 against thermal or physical stresses and secure the electrical connection of the semiconductor dies 200A-200D to the interposer 100a. In some embodiments, the underfill 400 is formed by capillary underfill filling (CUF). A dispenser (not shown) may apply a filling material 400a along the periphery of the semiconductor dies 200A-200D. In some embodiments, heating and/or reduced pressure may be applied to let the filling material 400a penetrate by capillarity in the interstices defined by the connectors 300 between the semiconductor dies 200A-200D and the interposer 100a. In some embodiments, the filling material 400a further penetrates in the gaps G between adjacent semiconductor dies 200A-200D. The extent to which the filling material 400a fills the gaps G may depend on the viscosity of the filling material 400a and the sizes and shapes of the gaps G, as well as the conditions adopted for the dispensing step. In some embodiments, a curing process (schematically represented by the curved arrows in FIG. 1C) is performed to consolidate the filling material 400a and form the underfill 400. In some embodiments, as shown in FIG. 1D, a single underfill 400 may extend below the semiconductor dies 200A-200D depending on the spacing and relative positions of the semiconductor dies 200A-200D over the interposer 100a. In some alternative embodiments, multiple underfill portions (not shown) are formed, each portion securing the connectors 300 of a semiconductor die 200A-200D. In some embodiments, the filling material 400a includes organic polymers. In some embodiments, the filling material 400a includes epoxy resins, phenol resins, polyolefins, acrylic resin, polyimide, benzocyclobutene (BCB), polybenzooxazole (PBO), or any other suitable polymer-based dielectric material. In some embodiments, a viscosity of the filling material 400a may be in the range between 0.1 (Pa s) to 10 (Pa s) at a temperature of 150° C. In some embodiments, a curing temperature for the filling material 400a may be in the range between 100° C. to 400° C. In some embodiments, the filling material 400a may be polyimide.

Figure 1E:
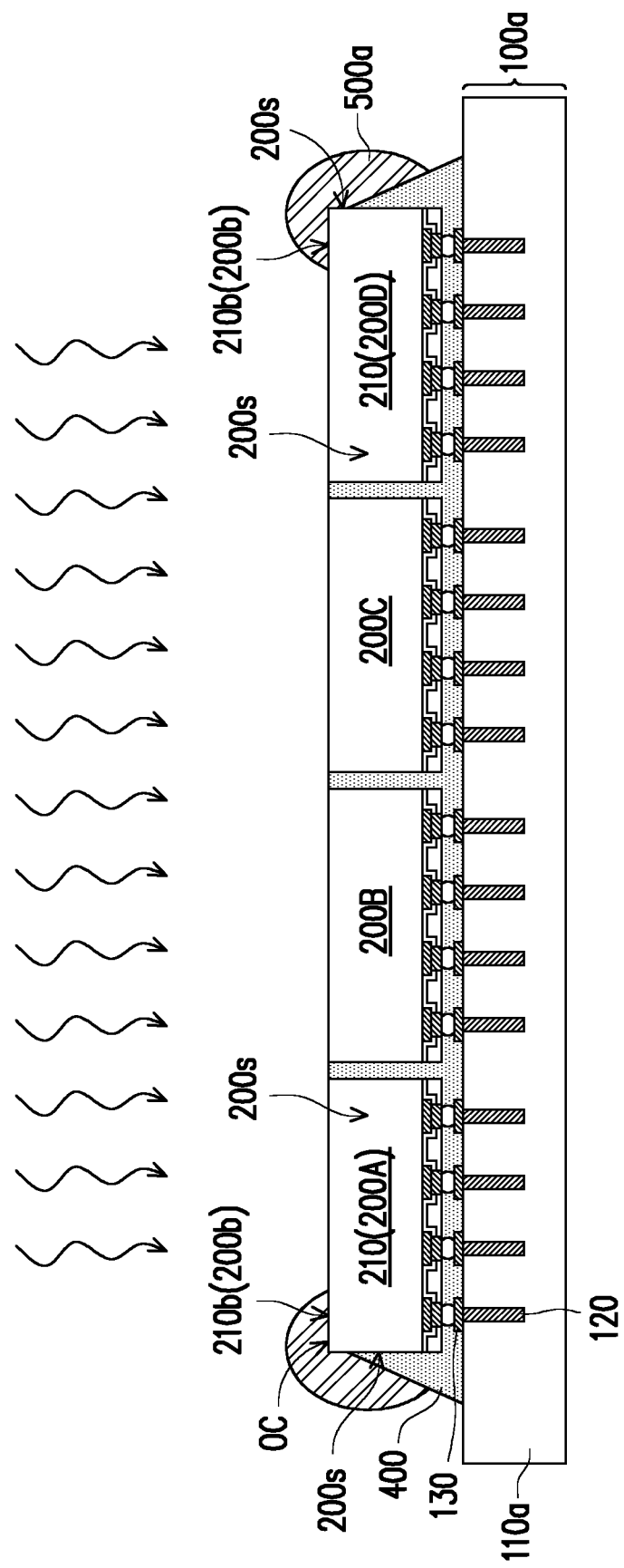

In some embodiments, referring to FIG. 1E, a corner padding material 500a may be disposed on the outer corners OC of the outer semiconductor dies 200A and 200D. In some embodiments, the corner padding material 500a extends on a portion of the backside surface 210b of the semiconductor substrate 210 adjacent to the outer corners OC, and along the side surfaces 200s forming the outer corners OC with the backside surface 210b. In some embodiments, the corner padding material 500a is disposed on the outer corners OC of the outer semiconductor dies 200A, 200D. The outer corners OC are formed by adjacent side surfaces 200s sharing an edge and not facing other semiconductor dies 200A-200D of the array. For example, in the cross-sectional view of FIG. 1E the outer semiconductor dies are the semiconductor dies 200A and 200D, as each of the semiconductor dies 200A and 200D includes at least one pair of adjacent side surfaces 200s which does not face another semiconductor die 200A-200D of the array. For example, the semiconductor die 200A has at least one pair of adjacent side surfaces 200s which do not face other semiconductor dies 200B-200D of the array. Similarly, the semiconductor die 200D has at least one pair of adjacent side surfaces 200s which do not face other semiconductor dies 200A-200C of the array. Taking the semiconductor die 200A as an example, an outer corner OC is formed by the backside surface 210b of the semiconductor substrate 210, by the left side surface 200s of the semiconductor die 200A in FIG. 1E and by the side surface 200s facing the point of view in FIG. 1E. A second outer corner (not visible in FIG. 1E) of the semiconductor die 200A is formed by the backside surface 210b, the left side surface 200s of the semiconductor die 200A and by the side surface (not visible in FIG. 1E) of the semiconductor die 200A opposite to the side surface 200s of the semiconductor die 200A facing the point of view in FIG. 1E. In some embodiments, a dispenser (not shown) may apply the corner padding material 500a on the outer corners OC of the outer semiconductor dies 200A and 200D. In some embodiments, the corner padding material 500a may be applied by screen-printing or other suitable processes. In some embodiments, the corner padding material 500a may have a globular shape, with a rounded outer profile. In some embodiments, the corner padding material 500a includes organic polymers. In some embodiments, the corner padding material 500a includes epoxy resins, phenol resins, polyolefins, acrylic resin, polyimide, benzocyclobutene (BCB), polybenzooxazole (PBO), or any other suitable polymer-based dielectric material. In some embodiments, a viscosity of the corner padding material 500a may be in the range between 0.1 (Pa s) to 10 (Pa s) at a temperature of 150° C. In some embodiments, the corner padding material 500a may be selected so as to have a higher viscosity than the filling material 400a (shown in FIG. 1C). In some embodiments, the higher viscosity of the corner padding material 500a allows the corner padding material 500a to preserve its shape until a subsequent curing process is performed. In some embodiments, referring to FIG. 1E and FIG. 1F, the curing process (schematically represented by the arrows in FIG. 1E) is performed to consolidate the corner padding material 500a and form the cured corner padding material 500b. In some embodiments, a curing temperature for the corner padding material 500a may be in the range between 100° C. to 400° C. In some embodiments, the corner padding material 500a is selected so as to have a higher curing temperature than the filling material 400a.

Figure 1F:
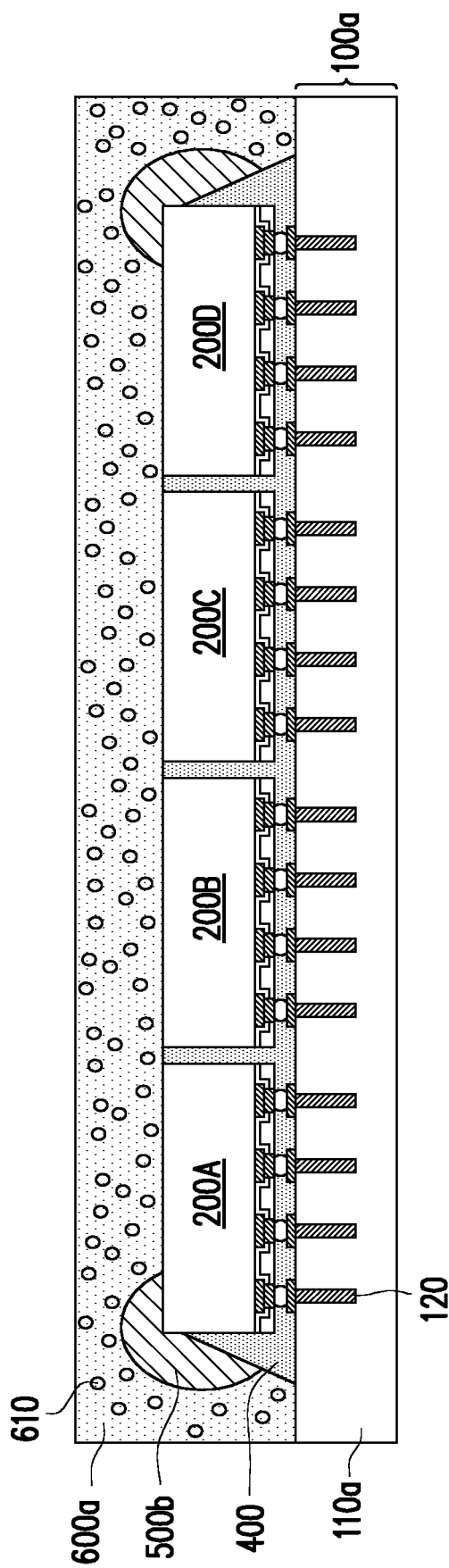
Figure 1G:
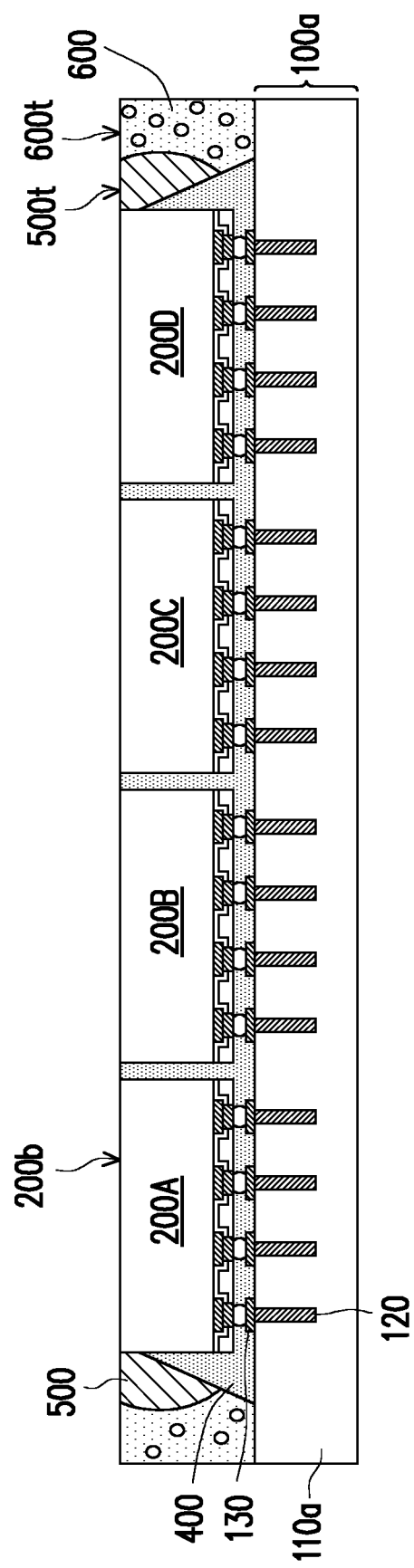

In some embodiments, referring to FIG. 1F, an encapsulating material 600a may be disposed on the interposer 100a to encapsulate the semiconductor dies 200A-200D, the underfill 400 and the cured corner padding material 500b. In some embodiments, the encapsulating material 600a includes a molding compound, a molding underfill, a resin (such as an epoxy resin), or the like. In some embodiments, the encapsulating material 600a includes an epoxy resin. In addition, the encapsulating material 600a may include fillers 610 doped therein. The fillers 610 may be spherical or angular particles, may have a nanoscale size, and may be made of silica, metal oxide, glass fiber, or the like. In some embodiments, the fillers 610 may be contained in the encapsulating material 600a, while no fillers may be included in the cured corner padding material 500b and the underfill 400. In some embodiments, the encapsulating material 600a is formed by an over-molding process. In some embodiments, the encapsulating material 600a is formed by a compression molding process. In some embodiments, the encapsulating material 600a fully covers the semiconductor dies 200A-200D, the underfill 400, and the cured corner padding material 500b. Referring to FIG. 1F and FIG. 1G, in some embodiments, a portion of the encapsulating material 600a is removed by a planarization process until the backside surfaces 200b of the semiconductor dies 200A-200D are exposed, thus forming an encapsulant 600. In some embodiments, the planarization of the encapsulating material 600a includes performing a mechanical grinding process and/or a chemical mechanical polishing (CMP) process. In some embodiments, a portion of the cured corner padding material 500b is also removed during the planarization process to form corner paddings 500. That is, the corner paddings 500 may have a truncated globular shape. Following planarization, backside surfaces 200b of the semiconductor dies 200A-200D may be substantially coplanar with a top surface 600t of the encapsulant 600 and with the top surfaces 500t of the corner paddings 500.

Figure 1H:
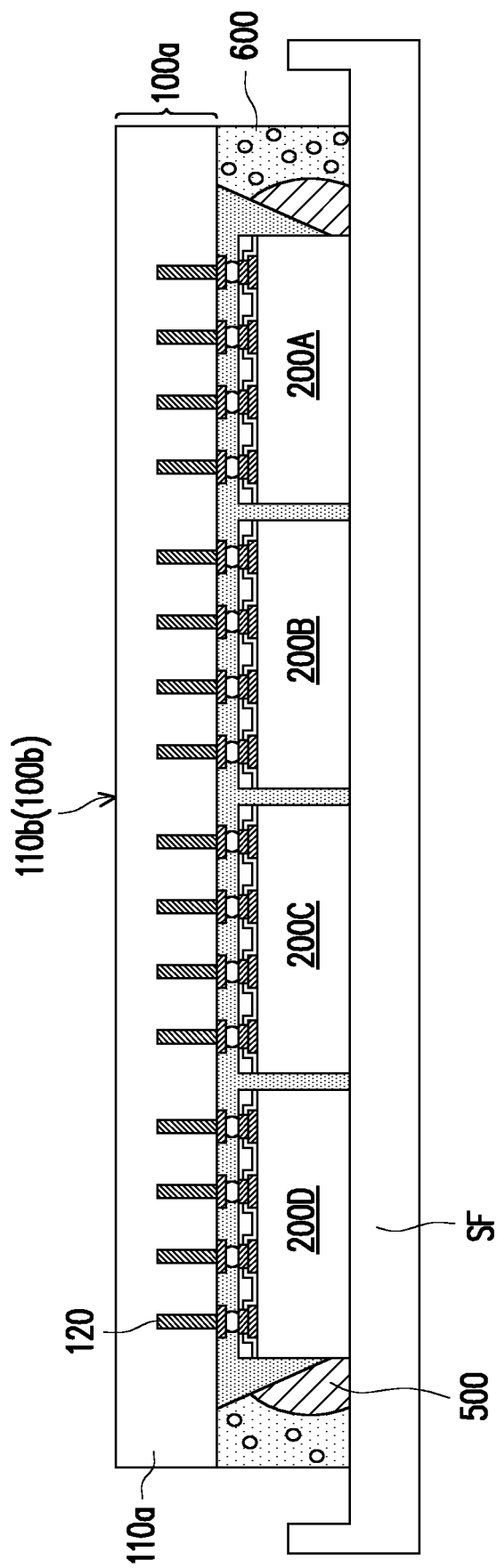
Figure 1I:
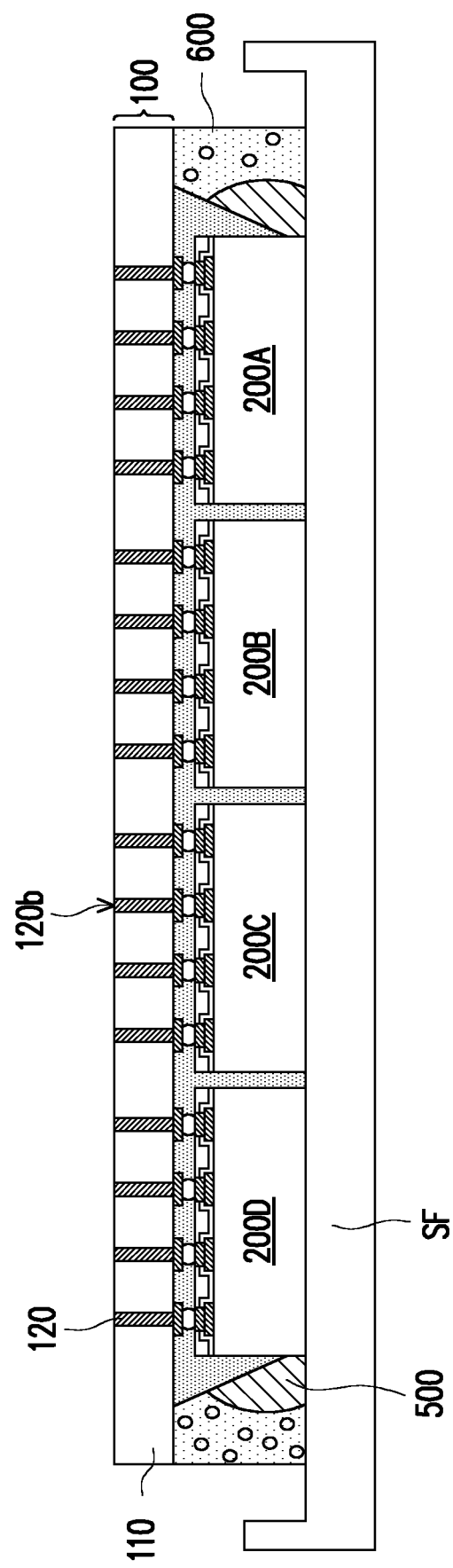

Referring to FIG. 1H, in some embodiments the structure of FIG. 1G may be overturned over a supporting frame SF to expose the bottom surface 110b of the interposer 100a for further processing. Referring to FIG. 1H and FIG. 1I, in some embodiments, the semiconductor substrate 110a is thinned from the side of the bottom surface 100b to form a semiconductor substrate 110. In some embodiments, a portion of the semiconductor substrate 110a is removed until the TSVs 120 are revealed. In some embodiments, the end 120b of the TSVs 120 may be substantially flush with the thinned semiconductor substrate 110. In some alternative embodiments (not shown), following the thinning of the semiconductor substrate 110a, the TSVs 120 may protrude with respect to the bottom surface 110b of the semiconductor substrate 110. That is, the end 120b of the TSVs 120 may be located at a level height higher than the bottom surface 110b of the semiconductor substrate 110. In some embodiments, the portion of the semiconductor substrate 110a may be removed through an etching process. The etching process includes, for example, an isotropic etching process and/or an anisotropic etching process. For example, the semiconductor substrate 110a may be thinned through a wet etching process, a dry etching process, or a combination thereof. In some embodiments, portions of the TSVs 120 may also be removed during thinning of the semiconductor substrate 110a.

Figure 1J:
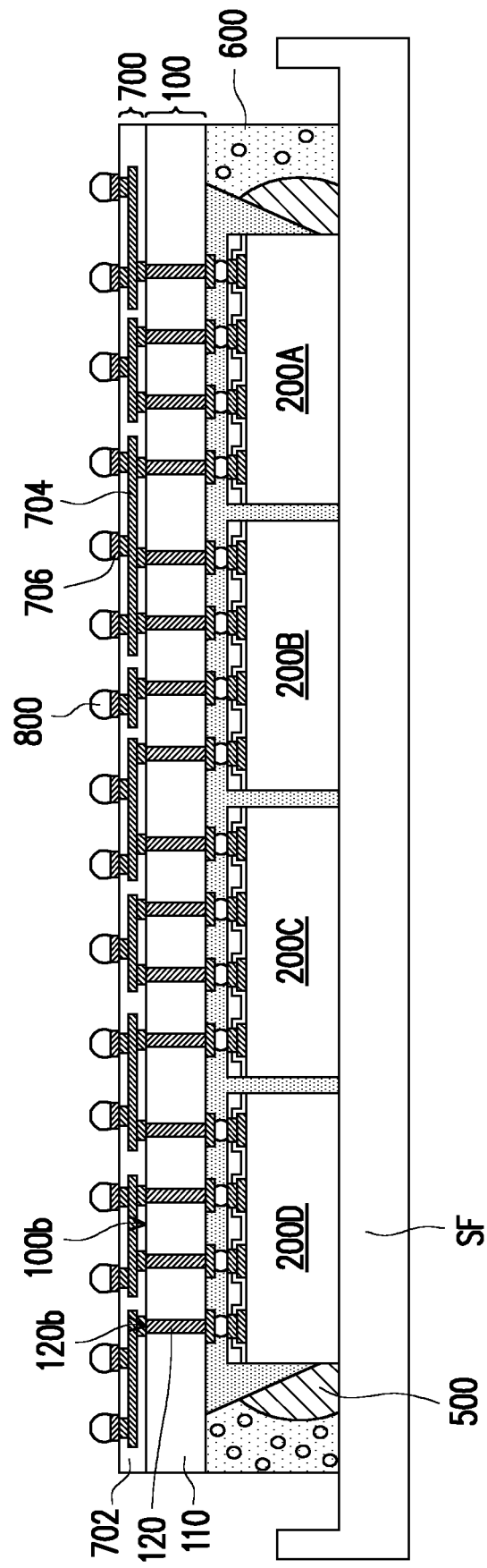

Referring to FIG. 1J, in some embodiments, a redistribution structure 700 is formed on the bottom surface 100b of the interposer 100. In some embodiments, the redistribution structure 700 includes a dielectric layer 702, a redistribution conductive layer 704, and a plurality of under-bump metallurgies 706. For simplicity, the dielectric layer 702 is illustrated as a single dielectric layer and the redistribution conductive layer 704 is illustrated as embedded in the dielectric layer 702. Nevertheless, from the perspective of the manufacturing process, the dielectric layer 702 is constituted by at least two dielectric layers. The redistribution conductive layer 704 may be constituted by a plurality of redistribution conductive patterns distributed in one or more metallization tiers. The redistribution conductive patterns of the redistribution conductive layer 704 are sandwiched between the two adjacent dielectric layers. Some of the redistribution conductive patterns may extend vertically through the dielectric layer 702 to establish electrical connection between different metallization tiers of the redistribution structure 700. Furthermore, some of the redistribution conductive patterns extend through the dielectric layer 702 to reach the TSVs 120 and establish electrical connection with the TSVs 120. That is, the (bottommost) dielectric layer 702 may include openings exposing the end 120b of the TSVs 120, and the redistribution conductive layer 704 may extend within the openings of the (bottommost) dielectric layer 702 to contact the TSVs 120. In some embodiments, the (outermost) dielectric layer 702 may be patterned to expose the underlying redistribution conductive layer 704. The under-bump metallurgies 706 may optionally be conformally formed in the openings of the (outermost) dielectric layer 702 exposing the redistribution conductive layer 704. In some embodiments, the under-bump metallurgies 706 further extend over portions of the exposed surface of the (outermost) dielectric layer 702. In some embodiments, the under-bump metallurgies 706 include multiple stacked layers. For example, the under-bump metallurgies 706 may include one or more metallic layers stacked on a seed layer.

In some embodiments, materials of the redistribution conductive layer 704 and the under-bump metallurgies 706 include aluminum, titanium, copper, nickel, tungsten, or alloys thereof. The redistribution conductive layer 704 and the under-bump metallurgies 706 may be formed by, for example, electroplating, deposition, and/or photolithography and etching. In some embodiments, the material of the dielectric layer 702 includes polyimide, epoxy resin, acrylic resin, phenol resin, benzocyclobutene (BCB), polybenzoxazole (PBO), or any other suitable polymer-based dielectric material. The dielectric layer 702, for example, may be formed by suitable fabrication techniques such as spin-on coating, chemical vapor deposition (CVD), plasma-enhanced chemical vapor deposition (PECVD), or the like. In some embodiments, the redistribution structure 700 may be fabricated through a semi-additive process, a damascene process, a dual damascene process or the like.

It should be noted that the number of the dielectric layers 702, the number of metallization tiers of the redistribution conductive layers 704 and the number of the under-bump metallurgies 706 illustrated in FIG. 1J are merely for illustrative purposes, and the disclosure is not limited thereto. In some alternative embodiments, fewer or more dielectric layers 702, fewer or more metallization tiers of the redistribution conductive layer 704, and fewer or more under-bump metallurgies 706 may be formed depending on the circuit design. When more metallization tiers of the redistribution conductive layer 704 and more layers of the dielectric layer 702 are required, the metallization tiers of the redistribution conductive layers 704 are still stacked alternately with the layers of the dielectric layer 702.

In some embodiments, conductive terminals 800 are formed on the redistribution structure 700. In some embodiments, the conductive terminals 800 are formed on the under-bump metallurgies 706, and are connected to the TSVs 120 and the semiconductor dies 200A-200D via the redistribution conductive layer 704. In some embodiments, the conductive terminals 800 are attached to the under-bump metallurgies 706 through a solder flux. In some embodiments, the conductive terminals 800 are controlled collapse chip connection (C4) bumps. In some embodiments, the conductive terminals 800 include a conductive material with low resistivity, such as Sn, Pb, Ag, Cu, Ni, Bi, or an alloy thereof. In some embodiments, the redistribution structure 700 is optional and may be omitted, and the conductive terminals 800 may be formed directly on the TSVs 120.

Figure 1K:
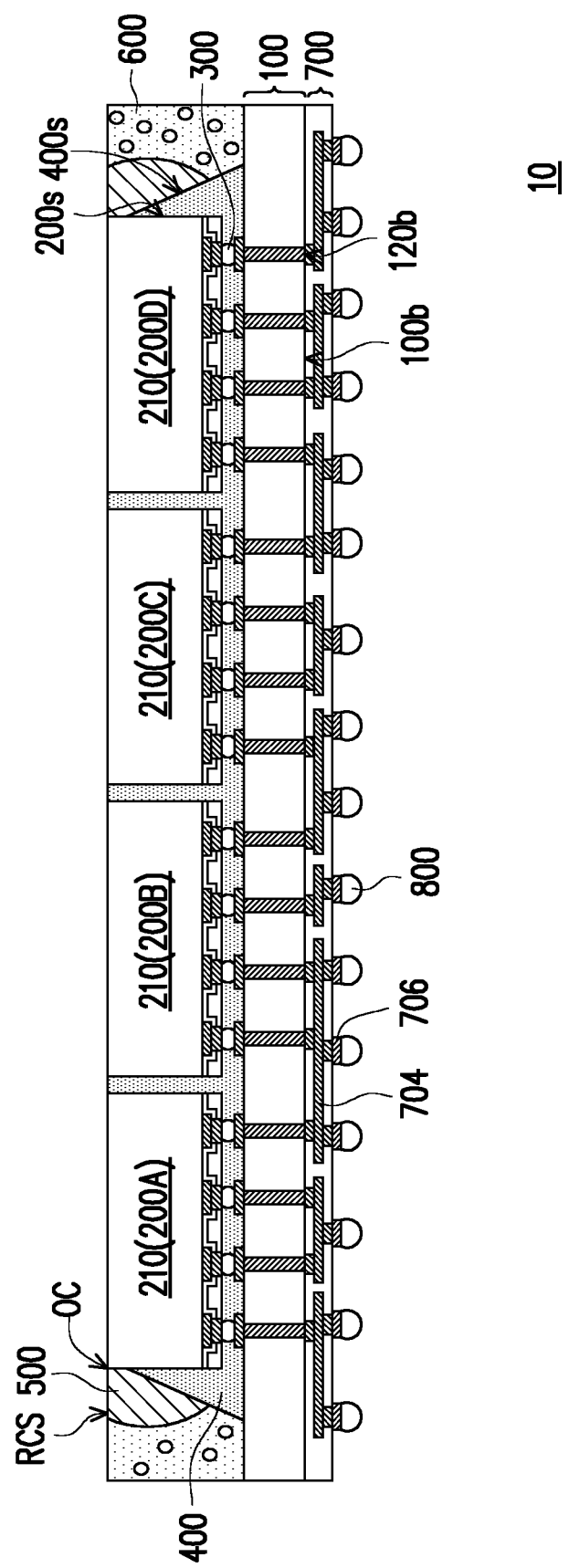

In some embodiments, after removal of the supporting frame SF a semiconductor package 10 is obtained. In some embodiments, the steps illustrated in FIG. 1A to FIG. 1K may be referred to as "chip on wafer (CoW) level packaging." As illustrated in FIG. 1K, the semiconductor dies 200A-200D are disposed on the interposer 100. In other words, multiple semiconductor dies 200A-200D are integrated into a single semiconductor package 10. As such, the semiconductor package 10 may be referred to as a "system on integrated circuit (SOIC) package." In some embodiments, by adapting the steps presented in FIG. 1A to FIG. 1K, heterogeneous or homogenous semiconductor components may be effectively integrated into a single semiconductor package with lower cost. For example, known-good-dies may be effectively integrated with a semiconductor wafer or another semiconductor die at a low cost.

In some embodiments, the semiconductor package 10 includes semiconductor dies 200A-200D connected to the interposer 100 via the connectors 300. The underfill 400 is disposed between the semiconductor dies 200A-200D and the interposer 100 to protect the connectors 300 from thermal and physical stresses. The semiconductor dies 200A-200D may be disposed in an array configuration on the interposer 100. Corner paddings 500 may be disposed at the outer corners OC of the outer semiconductor dies 200A and 200D. In some embodiments, the corner paddings 500 partially cover the side surfaces 200s of the outer semiconductor dies 200A and 200D which form the outer corners OC. In some embodiments, the underfill 400 may also partially cover the same side surfaces 200s covered by the corner paddings 500. In some embodiments, the underfill 400 is at least partially interposed between the corner paddings 500 and the side surfaces 200s. That is, the underfill 400 may have a sloped surface 400s extending from the side surfaces 200s to the interposer 100, and the corner paddings 500 may be disposed on an initial section (closer to the semiconductor die 200A or 200D) of the sloped surface 400s. The corner paddings 500 are also in direct contact with the underfill 400 and the encapsulant 600. In some embodiments, the corner paddings 500 have a truncated globular shape, and form rounded corner structures RCS for the corresponding semiconductor dies 200A and 200D (the outer semiconductor dies of the semiconductor dies 200A-200D). In some embodiments, the rounded corner structures RCS mitigate mechanical corner stress which may ensue at the interface between the semiconductor substrate 210 of the outer semiconductor dies 200A and 200D and the encapsulant 600. In some embodiments, by providing rounded corner structures RCS at the outer corners OC of the outer semiconductor dies 200A and 200D, the mechanical stress experienced by the encapsulant 600 in correspondence of the outer corners OC may be reduced, and the occurrence of cracks may be reduced. That is, by providing rounded corner structures RCS for the outer semiconductor dies 200A and 200D, the mechanical stability of the semiconductor package 10 may be enhanced, and its reliability and lifetime may increase. In some embodiments, even when the semiconductor package 10 is a large-scale semiconductor package the mechanical corner stress may be effectively reduced by providing rounded corner structures RCS, for example by including the corner paddings 500.

Figure 1L:
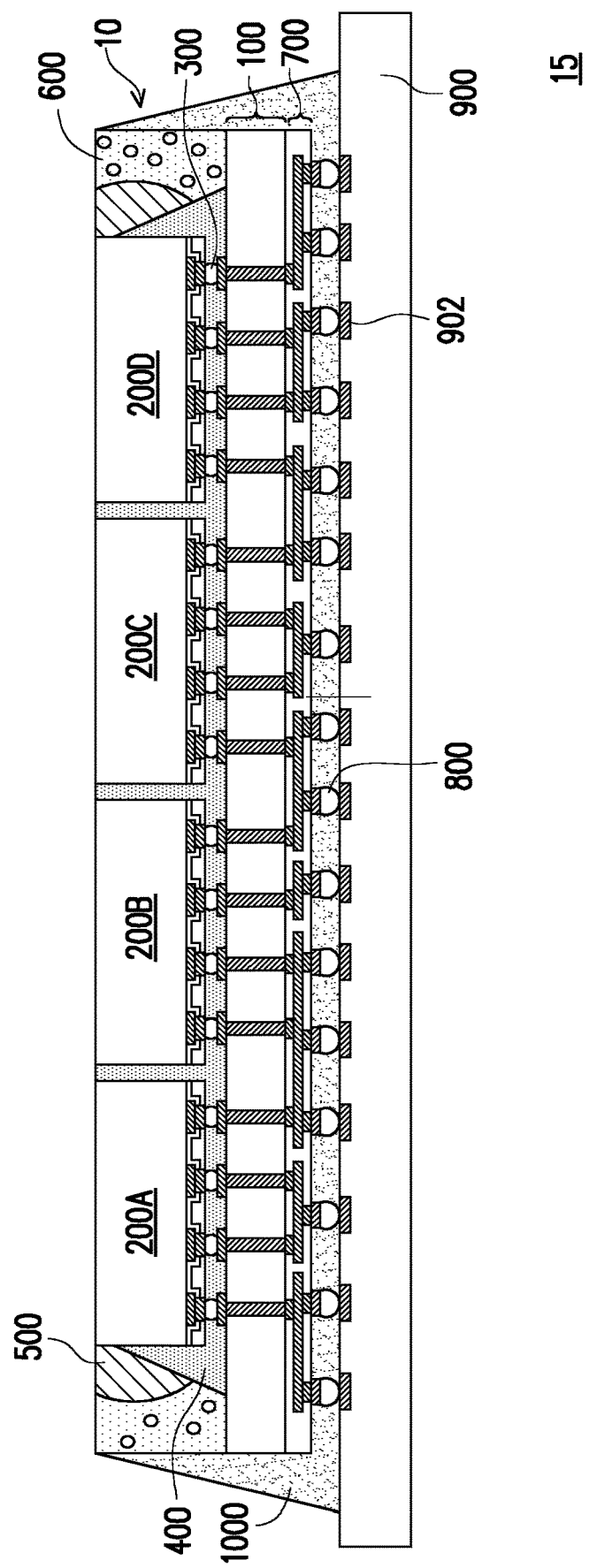
FIG. 1L is a schematic cross-sectional view of a semiconductor device according to some embodiments of the disclosure.

Referring to FIG. 1L, in some embodiments the semiconductor package 10 may be integrated in larger semiconductor devices 15. For example, the semiconductor package 10 may be connected to a circuit substrate 900 via the conductive terminals 800. In some embodiments, the conductive terminals 800 establish electrical contact with contact pads 902 formed on a surface of the circuit substrate 900. In some embodiments, the circuit substrate 900 may be a mother board, a printed circuit board, or the like. In some embodiments, the semiconductor device 15 may be referred to as a Chip on Wafer on Substrate (CoWoS) semiconductor device. In some embodiments, an underfill 1000 may be provided on the circuit substrate 900 to protect the conductive terminals 800 from thermal or mechanical stresses. In some embodiments, a material of the underfill 1000 may be different from a material of the underfill 400 included in the semiconductor package 10.

Figure 2:
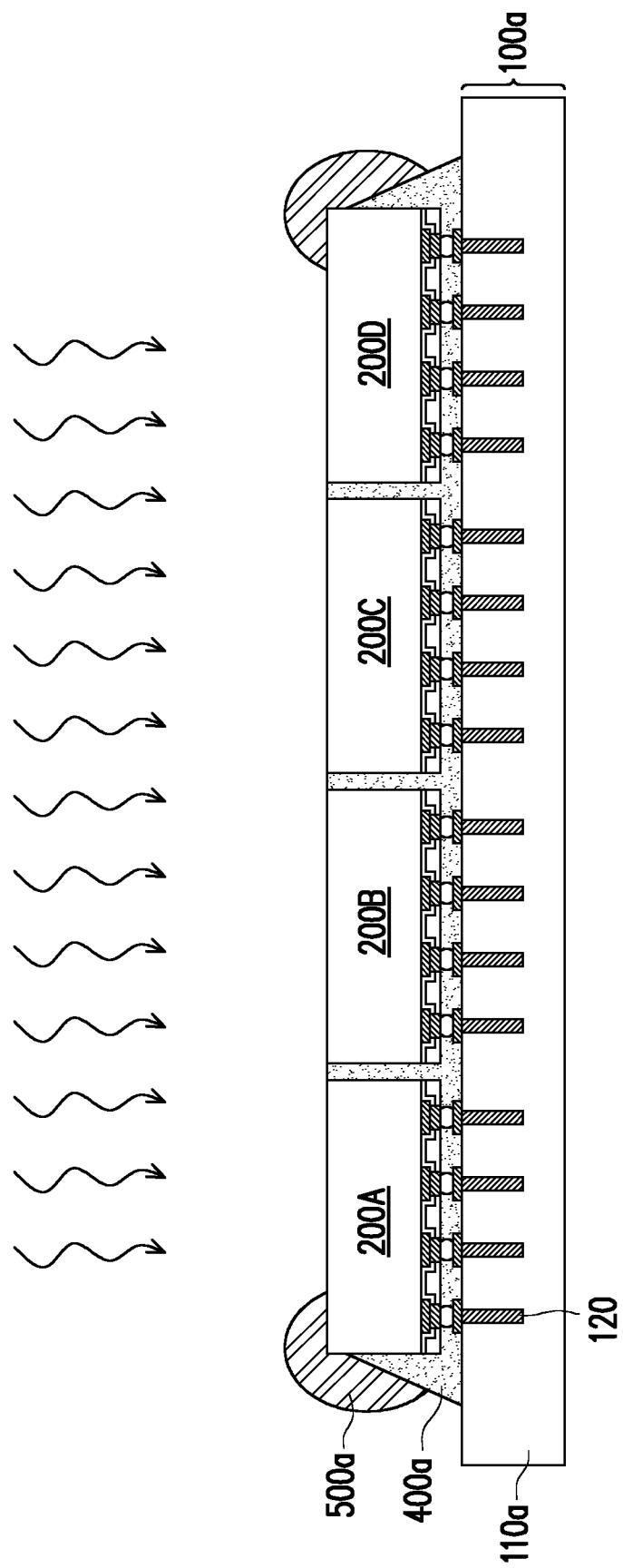
FIG. 2 is a schematic cross-sectional view illustrating a manufacturing process of a semiconductor package in accordance with some embodiments of the disclosure.

FIG. 2 is a schematic cross-sectional view of a structure produced during a manufacturing method of the semiconductor package 10 according to some alternative embodiments. The structure of FIG. 2 may be obtained from the structure illustrated in FIG. 1B by providing the filling material 400a on the interposer 100 and the corner padding material 500a on the semiconductor dies 200A and 200D without performing intermediate curing steps. That is, the filling material 400a may be dispensed on the interposer 100 similarly to what described with respect to FIG. 1C, and the corner padding material 500a may be disposed on the semiconductor dies 200A and 200D and the filling material 400a before the filling material 400a is cured. That is, the corner padding material 500a and the filling material 400a may be cured together during a same curing step. In some embodiments, suitable combination of materials may be selected to cure together the filling material 400a and the corner padding material 500a. For example, a first polyimide may be selected for the filling material 400a, and a second polyimide may be selected for the corner padding material 500a. In some embodiments, a viscosity of the second polyimide may be higher than a viscosity of the first polyimide at 150° C. In this case, the filling material 400a and the corner padding material 500a may be cured together, for example at a curing temperature comprised in the range from 100° C. to 400° C. for a time comprised in the range from 2 hours to 12 hours. After curing, the manufacturing process of the semiconductor package 10 may follow the steps described above with reference to FIG. 1F to FIG. 1K.

Figure 3:
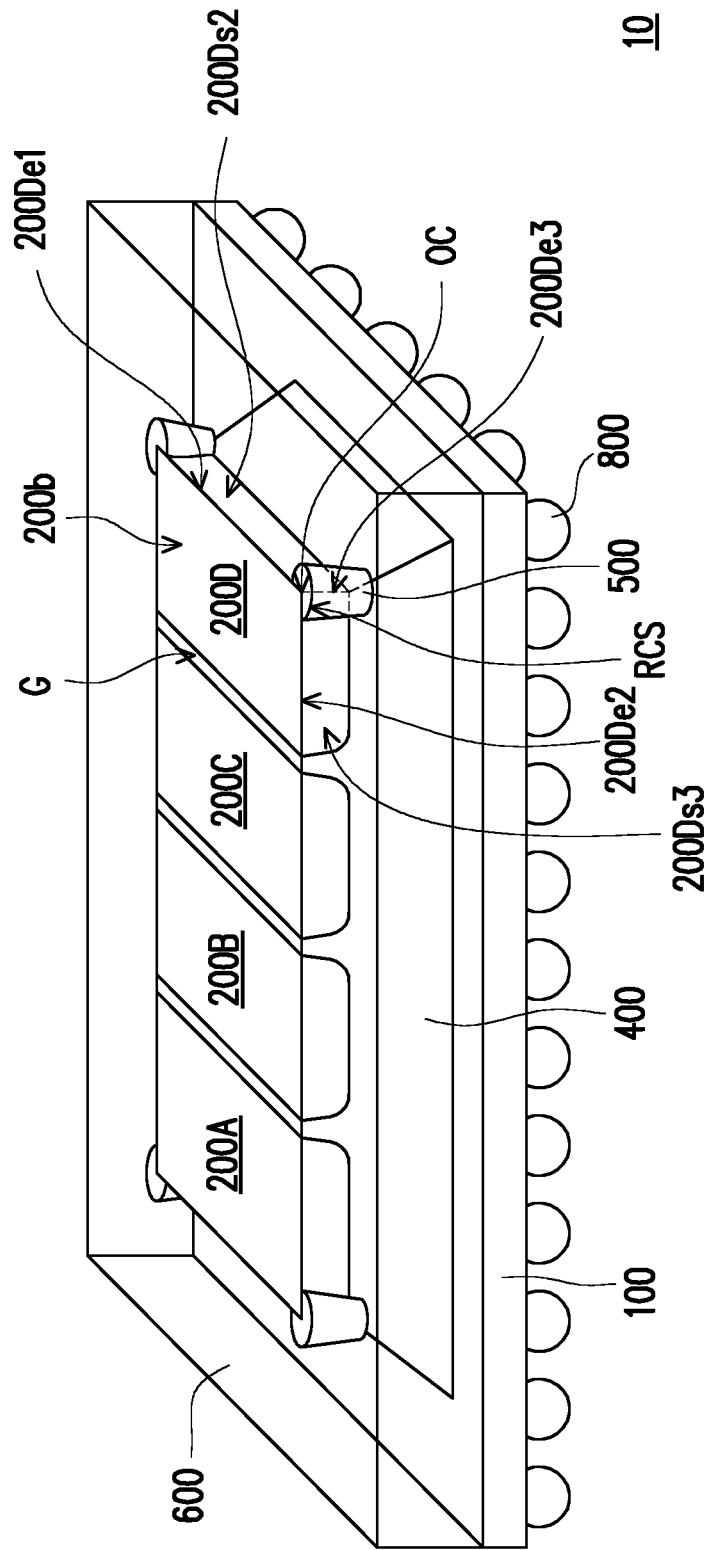
FIG. 3 is a perspective view of a semiconductor package in accordance with some embodiments of the disclosure.
Figure 4A:
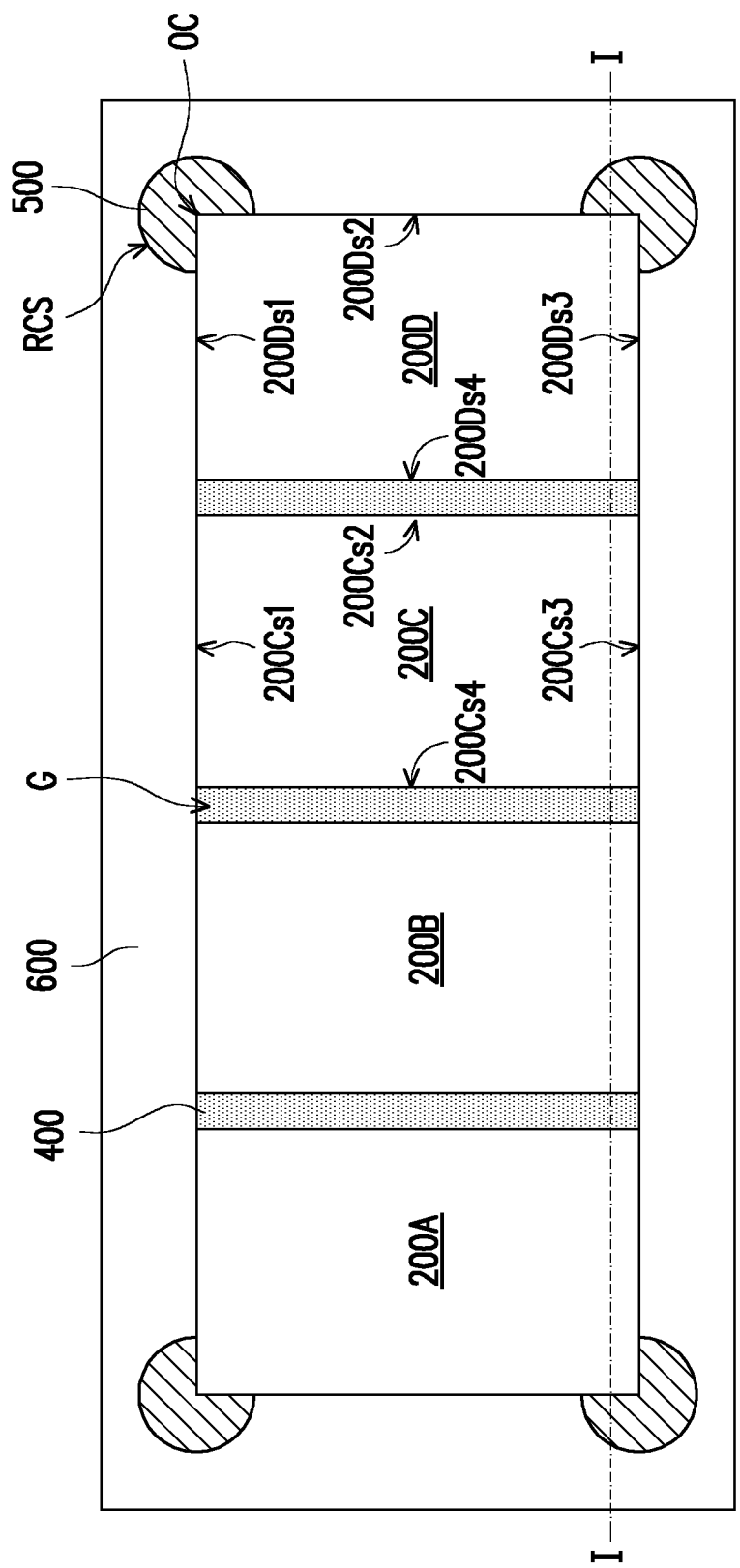
FIG. 4A to FIG. 4D are schematic top views of semiconductor packages in accordance with some embodiments of the disclosure.

FIG. 3 is a schematic perspective view of the semiconductor package 10 according to some embodiments of the disclosure. FIG. 4A is a schematic top view of the semiconductor package 10 according to some embodiments of the disclosure. The cross-sectional views of FIG. 1A to FIG. 1K were taken along the line I-I shown in FIG. 4A. In the views of FIG. 3 and FIG. 4A are illustrated the interposer 100, the semiconductor dies 200A-200D disposed in a linear array and laterally surrounded by the encapsulant 600, the underfill 400, the corner paddings 500, and the conductive terminals 800. In FIG. 3, surfaces and elements which would be covered by the encapsulant 600 are illustrated for clarity of illustration, but the material of the encapsulant 600 is not limited to be transparent. Similarly, fillers 610 (shown in FIG. 1F) which may be contained in the encapsulant 600 are omitted from FIG. 3 and FIG. 4A for clarity of illustration. As illustrated in the views of FIG. 3 and FIG. 4A, the outer semiconductor dies 200A and 200D of the linear array are provided with rounded corner structures RCS at the outer corners OC. Referring to the semiconductor die 200D, the outer corners OC are the corners formed by a pair of surfaces sharing an edge between themselves and with the backside surface 200b and not facing the adjacent semiconductor die 200C. For example, an outer corner OC is the one formed by the side surface 200Ds2, the side surface 200Ds3 (which shares the edge 200De3 with the side surface 200Ds2) and the backside surface 200b. As illustrated in FIG. 3, the side surface 200Ds2 shares the edge 200De2 with the backside surface 200b, and the side surface 200Ds3 shares the edge 200De1 with the backside surface 200b. Another outer corner OC of the semiconductor die 200D is the one defined by the backside surface 200b with the side surfaces 200Ds1 and 200Ds2. The backside surface 200b also shares an edge with the side surface 200Ds4, however the side surface 200Ds4 faces the semiconductor die 200C, and, as such, it is not considered to form outer corners. For the same reason, because the side surfaces 200Cs4 and 200Cs2 of the semiconductor die 200C respectively face the semiconductor dies 200B and 200D, the semiconductor die 200C does not form any outer corner, and is not considered to be an outer semiconductor die. The same applies to the semiconductor die 200B, while the semiconductor die 200A includes two outer corners OC on which the corner paddings 500 are provided. However, the disclosure is not limited thereto. In some alternative embodiments, the corner paddings 500 may be formed on any corner formed by the backside surface 200b, with any pair of side surfaces. For example, additional corner paddings 500 may be formed on inner corners when the distance between adjacent semiconductor dies 200 is greater than 10 μm. In some embodiments, the distance between adjacent semiconductor dies 200 may be in the range from 10 μm to 500 μm.

Figure 4B:
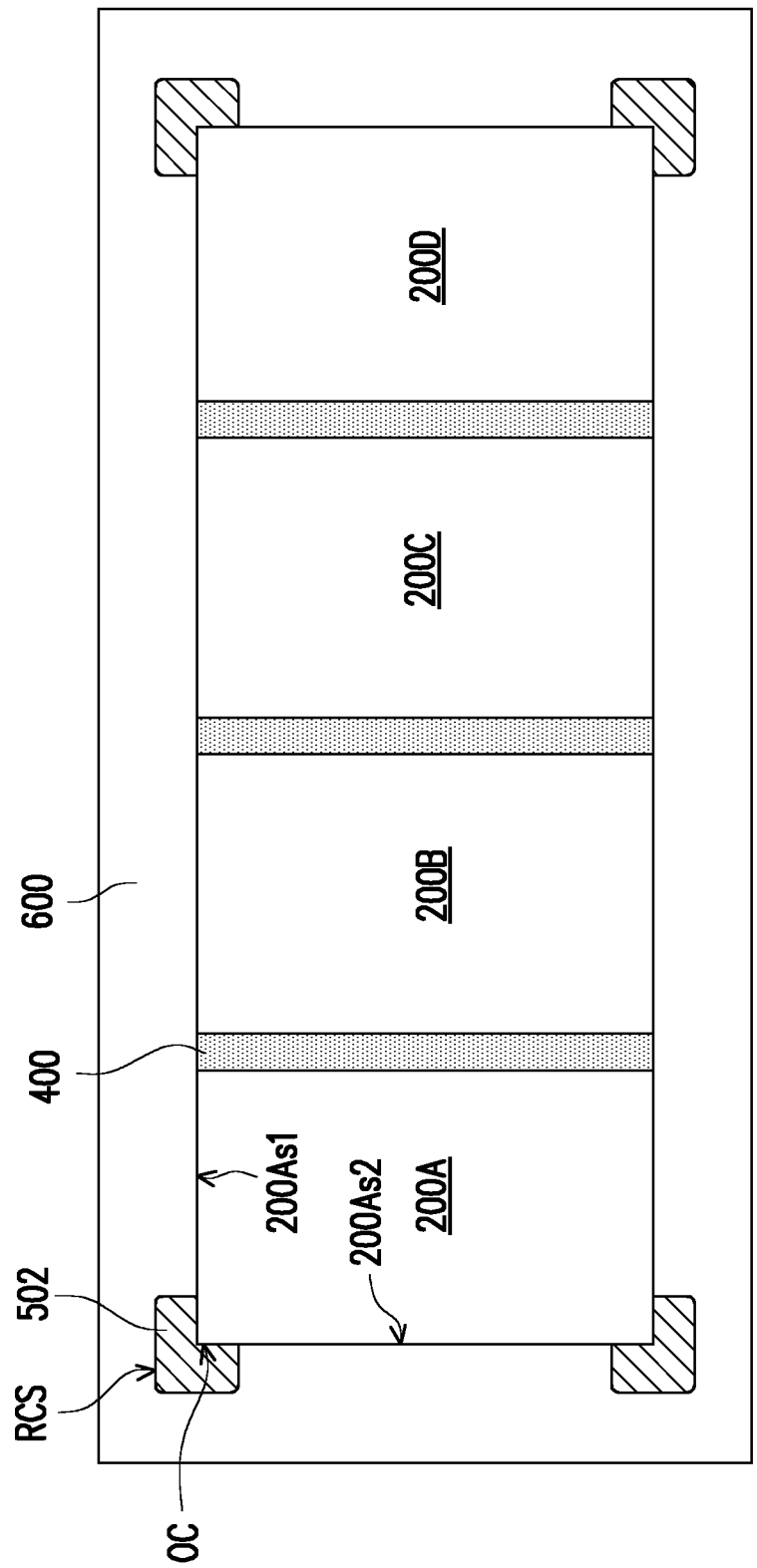

FIG. 4B is a schematic top view of a semiconductor package 20 according to some embodiments of the disclosure. A difference between the semiconductor package 20 of FIG. 4B and the semiconductor package 10 of FIG. 4A lies in the shape of the corner paddings 502. That is, in the semiconductor package 20 of FIG. 4B, the corner paddings have a shape elongated along the direction of the edges between each of the surfaces 200As1 or 200As2 with the backside surface 200b (illustrated, e.g., in FIG. 3). That is, an outline of the corner paddings 502 when viewed from the top may be different from a circular sector (as illustrated for the paddings 500 in the top view of FIG. 4A). However, because the corner paddings 502 do not present sharp corners, they can still provide rounded corner structures RCS at the outer corners OC of the outer semiconductor dies 200A and 200D.

Figure 4C:
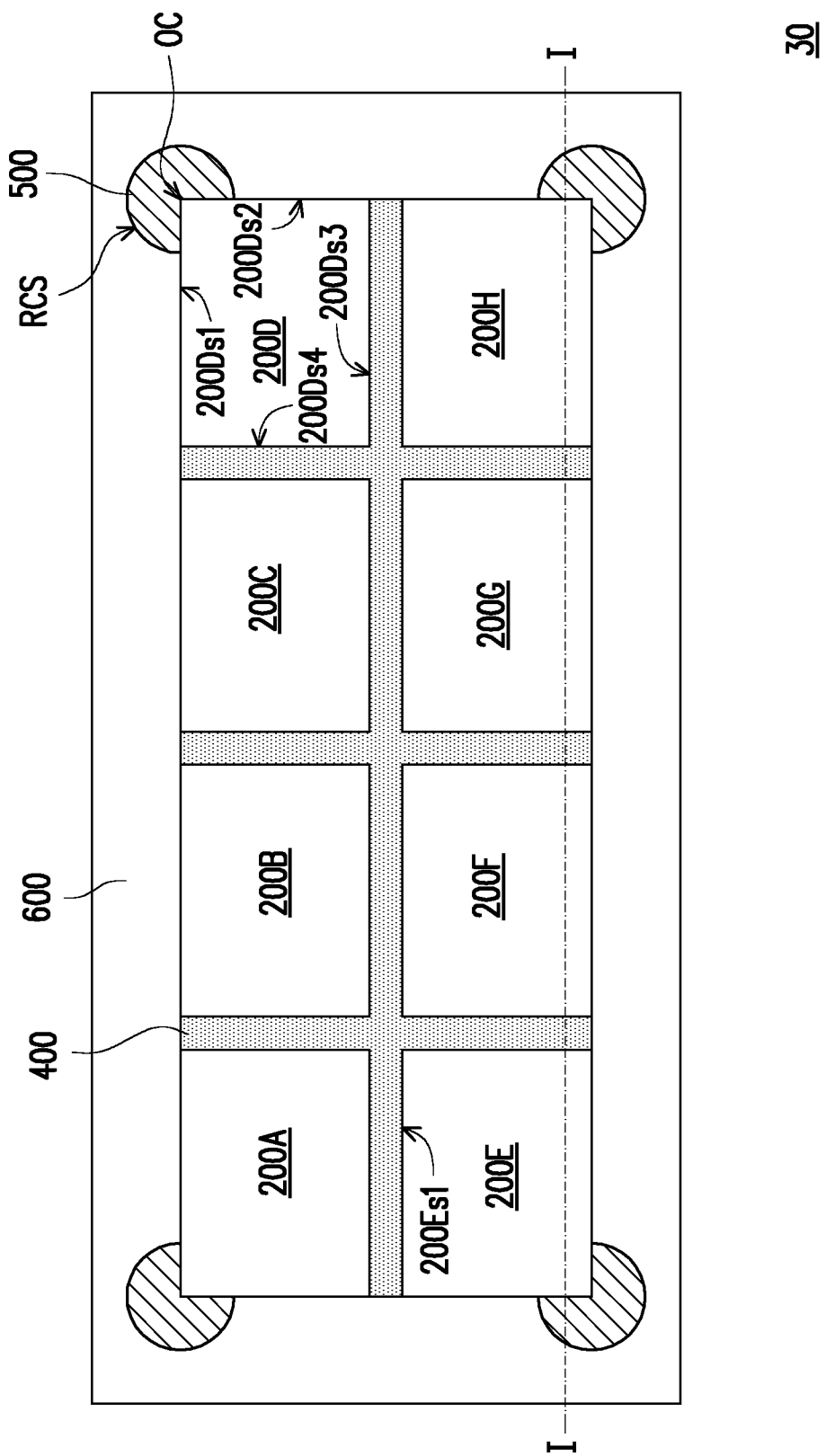

FIG. 4C is a schematic top view of a semiconductor package 30 according to some embodiments of the disclosure. A difference between the semiconductor package 30 of FIG. 4C and the semiconductor package 10 of FIG. 4A lies in the number of semiconductor dies 200A-200H disposed in the array configuration. In the semiconductor package 30, eight semiconductor dies 200A-200H are disposed in an array of two rows by four columns. For example, semiconductor die 200A faces the semiconductor die 200B in the same row, and faces the semiconductor die 200E in the same column. In the semiconductor dies array of the semiconductor package 30, the semiconductor dies 200A, 200E, 200D and 200H are outer semiconductor dies, as each one has a pair of adjacent side surfaces (e.g., 200Ds1 with 200Ds2 for the semiconductor die 200D) which does not face another semiconductor die of the array (e.g., the semiconductor dies 200A-C and 200E-H for the semiconductor die 200D). Each outer semiconductor die 200A, 200E, 200D, 200H has one outer corner OC on which a corner padding 500 is formed. Taking as an example the semiconductor die 200D, the semiconductor die 200D includes a single outer corner OC, formed by the backside surface 200b (illustrated, e.g., in FIG. 3) with the surfaces 200Ds1 and 200Ds2. In the semiconductor package 30, the surface 200Ds3 (which in the semiconductor package 10 also formed an outer corner OC and had a corner padding 500 formed on, cf. FIG. 4A) faces the semiconductor die 200H, and, as such, does not form an outer corner.

Figure 4D:
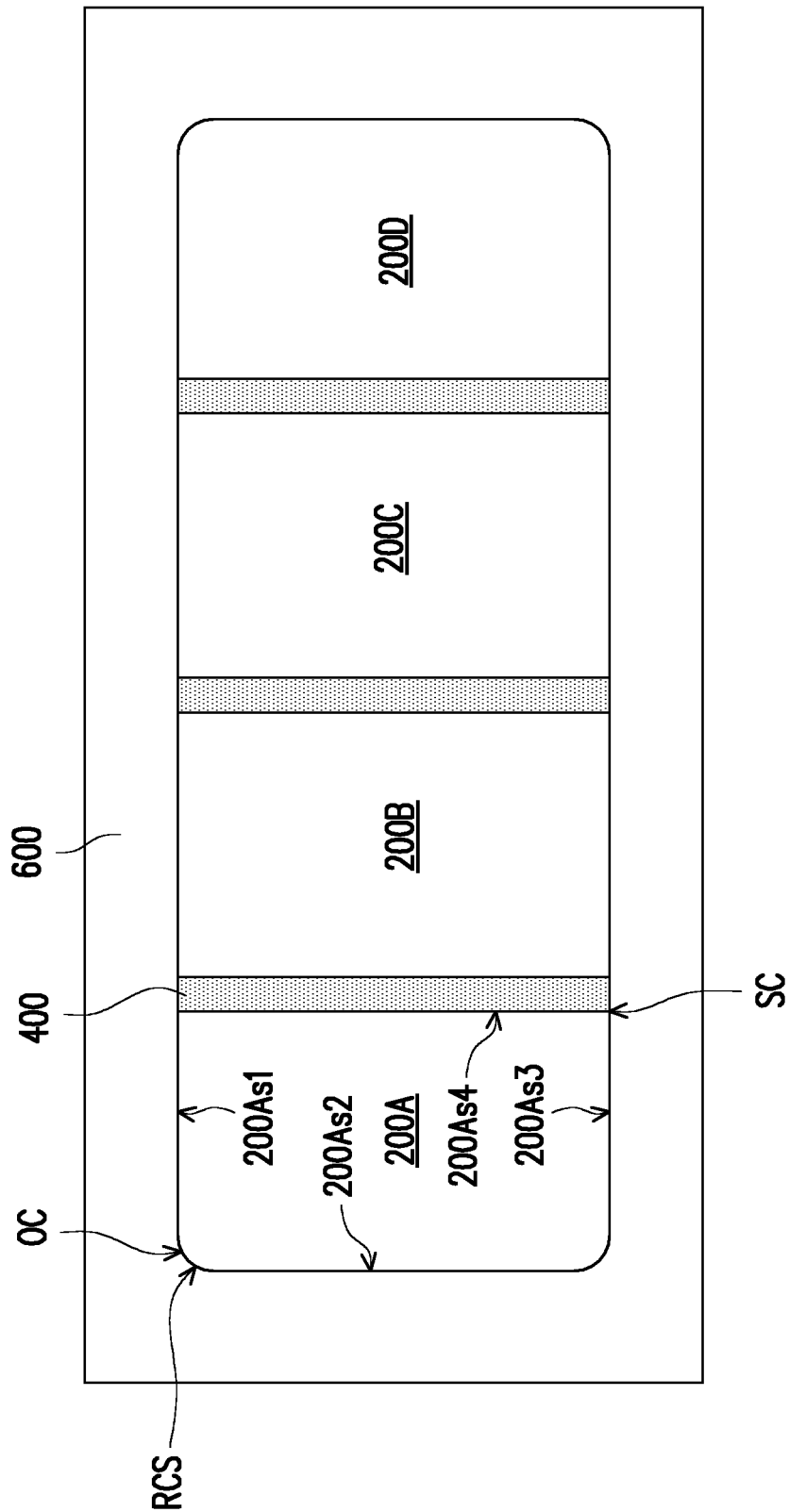

FIG. 4D is a schematic top view of a semiconductor package 40 according to some embodiments of the disclosure. A difference between the semiconductor package 40 of FIG. 4D and the semiconductor package 10 of FIG. 4A is that the rounded corner structures RCS at the outer corners OC of the outer semiconductor dies 200A and 200D are provided without forming corner paddings 500 (shown in FIG. 4A). Rather, the outer corners OC are smoothened during manufacturing of the semiconductor package 40, for example via a laser cutting step. In some embodiments, by smoothening the outer corners OC of the outer semiconductor dies 200A and 200D, mechanical stress at the interface between the backside surface 200b (illustrated, e.g., in FIG. 1B) and the encapsulant 600 may be reduced, thus reducing or preventing occurrence of cracking in the encapsulant 600. As illustrated in FIG. 4D, in some embodiments the outer corners OC are smoothened, while the other corners formed by the backside surface 200b may be left sharp. For examples, considering the semiconductor die 200A, the backside surface 200b may form outer corners OC with pairs of the adjacent side surfaces 200As1, 200As2, and 200As3 which are smoothened, and may form corners with the side surface 200As4 in combination with the side surface 200As1 or 200As3 which are not smoothened (sharp corners SC). In some embodiments, the outer corners OC may be smoothened, for example via laser cutting, on the structure of FIG. 1D, before forming the encapsulant 600 and skipping formation of the corner paddings 500. However, the disclosure is not limited thereto. In some alternative embodiments, the corner paddings 500 may also be formed on the outer corners OC after the outer corners OC have been smoothened.

In accordance with some embodiments of the disclosure, a semiconductor package includes an interposer, semiconductor dies, and an encapsulant. Each semiconductor dies includes an active surface, a backside surface, and side surfaces. The backside surface is opposite to the active surface. The side surfaces join the active surface to the backside surface. The encapsulant includes a first material and laterally wraps the semiconductor dies. The semiconductor dies are electrically connected to the interposer, and are disposed side by side on the interposer with the respective backside surfaces facing away from the interposer. At least one semiconductor die of the semiconductor dies includes an outer corner. A rounded corner structure is formed at the outer corner of the at least one semiconductor die. The rounded corner structure includes a second material different from the first material. The outer corner is formed by the backside surface of the at least one semiconductor die and a pair of adjacent side surfaces of the side surfaces of the at least one semiconductor die. The side surfaces of the pair have a common first edge. Each side surface of the pair does not face other semiconductor dies and has a second edge in common with the backside surface of the at least one semiconductor die.

In accordance with some embodiments of the disclosure, a semiconductor package includes a first semiconductor substrate, semiconductor dies, an underfill, a corner padding, and an encapsulant. The first semiconductor substrate has through semiconductor vias formed therethrough. The semiconductor dies are disposed side by side on the first semiconductor substrate and are electrically connected to the through semiconductor vias. The underfill is disposed between the first semiconductor substrate and the semiconductor dies. The corner padding is in physical contact with one semiconductor die of the semiconductor dies. The corner padding is disposed on the underfill in correspondence of an outer corner of the one semiconductor die. The corner padding includes a first material. The encapsulant includes a second material different from the first material. The encapsulant is disposed on the first semiconductor substrate. The encapsulant laterally wraps the semiconductor dies, the corner padding and the underfill.

In accordance with some embodiments of the disclosure, a manufacturing method of a semiconductor package includes at least the following steps. Semiconductor dies are electrically connected to an interposer via connectors. The connectors are disposed at active surfaces of the semiconductor dies. A filling material is dispensed on the interposer surrounding the connectors and in gaps between adjacent semiconductor dies. The filling material is cured to form an underfill. A rounded corner structure is formed on a backside surface of a first semiconductor die of the semiconductor dies. The backside surface is opposite to the active surface of the first semiconductor die. The rounded corner structure includes a first material. An encapsulant is formed laterally wrapping the semiconductor dies and the underfill. The encapsulant includes a second material. The rounded corner structure is in contact with the encapsulant. The first material is different from the second material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   an interposer;
   semiconductor dies, each semiconductor die comprising:
      an active surface;
      a backside surface opposite to the active surface; and
      side surfaces joining the active surface to the backside surface; and
   an encapsulant, including a first material and laterally wrapping the semiconductor dies,
   wherein the semiconductor dies are electrically connected to the interposer and disposed side by side on the interposer with the respective backside surfaces facing away from the interposer, at least one semiconductor die of the semiconductor dies comprises an outer corner, a rounded corner structure is disposed at the outer corner of the at least one semiconductor die, the rounded corner structure is in direct contact with the encapsulant and the outer corner of the at least one semiconductor die is spaced apart from the encapsulant by the rounded corner structure, the rounded corner structure comprises a second material different from the first material, and the outer corner is formed by the backside surface of the at least one semiconductor die and a pair of adjacent side surfaces of the at least one semiconductor die, the side surfaces of the pair have a common first edge, each side surface of the pair does not face other semiconductor dies and has a second edge in common with the backside surface of the at least one semiconductor die, and the rounded corner structure partially covers each side surface of the pair.

2. The semiconductor package of claim 1, further comprising a corner padding forming the rounded corner structure.

3. The semiconductor package of claim 2, further comprising an underfill disposed in contact with the pair of adjacent side surfaces of the at least one semiconductor die and the corner padding.

4. The semiconductor package of claim 3, wherein the underfill is at least partially disposed between the corner padding and the pair of adjacent side surfaces of the at least one semiconductor die.

5. The semiconductor package of claim 2, wherein the backside surfaces of the semiconductor dies and a top surface of the corner padding are substantially horizontally coplanar with a top surface of the encapsulant.

6. The semiconductor package of claim 2, wherein the backside surfaces of the semiconductor dies are spaced apart from the rounded corner structure by the under fill.

7. The semiconductor package of claim 1, wherein the backside surfaces of the semiconductor dies are spaced apart from the rounded corner structure.

8. A semiconductor package, comprising:
a first semiconductor substrate having through semiconductor vias;
semiconductor dies disposed side by side on the first semiconductor substrate and electrically connected to the through semiconductor vias;
an underfill disposed between the first semiconductor substrate and the semiconductor dies;
a corner padding in physical contact with one semiconductor die of the semiconductor dies, disposed on the underfill in correspondence of an outer corner of a backside surface of the one semiconductor die, and comprising a first material, wherein a top surface of the corner padding is substantially horizontally coplanar with the backside surface of the one semiconductor die, the top surface of the corner padding and the backside surface of the one semiconductor die face away from the first semiconductor substrate; and
an encapsulant comprising a second material different from the first material and disposed on the first semiconductor substrate, laterally wrapping the semiconductor dies, the corner padding, and the underfill, wherein the outer corner of the backside surface of the one semiconductor die is spaced apart from the encapsulant by the corner padding which is in direct contact with the encapsulant, wherein the semiconductor dies are disposed on the first semiconductor substrate in an array configuration, the one semiconductor die comprises a pair of adjacent side surfaces, the side surfaces of the pair of adjacent side surfaces have a common first edge, each side surface of the pair of adjacent side surfaces connects the backside surface of the one semiconductor die to the active surface of the one semiconductor die and does not face other semiconductor dies of the array, the outer corner of the backside surface of the one semiconductor die is formed by the backside surface of the one semiconductor die and the pair of adjacent side surfaces of the one semiconductor die, and the corner padding partially covers each side surface of the pair of adjacent side surfaces.

9. The semiconductor package of claim 8, wherein the underfill includes a third material, and the first material, the second material, and the third material are different from each other.

10. The semiconductor package of claim 9, wherein the first material includes a first polyimide, the second material includes an epoxy resin, and the third material includes a second polyimide.

11. The semiconductor package of claim 8, wherein the underfill includes an inclined surface extending from a side surface of the one semiconductor die to the first semiconductor substrate, the side surface of the one semiconductor die shares an edge with the backside surface of the one semiconductor die, and the corner padding is disposed on the inclined surface.

12. The semiconductor package of claim 8, further comprising connectors disposed at an active surface of the one semiconductor die opposite to the backside surface of the one semiconductor die to establish electrical connection between the one semiconductor die and the through semiconductor vias.

13. The semiconductor package of claim 8, wherein the backside surface of the one semiconductor die forms a second outer corner, and a second corner padding is formed on the second outer corner of the one semiconductor die.

14. The semiconductor package of claim 8, wherein the top surface of the corner padding is substantially horizontally planar with a top surface of the encapsulant.

15. A manufacturing method of a semiconductor package, comprising:
electrically connecting semiconductor dies to an interposer through connectors disposed at active surfaces of the semiconductor dies, each semiconductor die further comprises a backside surface opposite to the active surface and side surfaces joining the active surface to the backside surface, wherein the semiconductor dies are electrically connected to the interposer and disposed side by side on the interposer with the respective backside surfaces facing away from the interposer;
dispensing filling material on the interposer surrounding the connectors and in gaps between adjacent semiconductor dies;
curing the filling material to form an underfill;
forming a rounded corner structure comprising a first material on a backside surface of a first semiconductor die of the semiconductor dies, the backside surface of the first semiconductor die being opposite to the active surface of the first semiconductor die; and
forming an encapsulant comprising a second material and laterally wrapping the semiconductor dies and the underfill, wherein an outer corner of the first semiconductor die is spaced apart from the encapsulant by the rounded corner structure, the rounded corner structure is disposed at the outer corner of the at least one semiconductor die, and the rounded corner structure is in direct contact with the encapsulant, the outer corner is formed by the backside surface of the at least one semiconductor die and a pair of adjacent side surfaces of the first semiconductor die, the side surfaces of the pair have a common first edge, each side surface of the pair does not face other semiconductor dies and has a second edge in common with the backside surface of the first semiconductor die, and the rounded corner structure partially covers each side surface of the pair; and the first material is different from the second material.

16. The manufacturing method of claim 15,
wherein the first material includes a semiconductor material, and
the outer corner of the first semiconductor die is formed by the backside surface of the first semiconductor die and a pair of adjacent side surfaces of the first semiconductor die,
the side surfaces of the pair have a common first edge, and
each side surface of the pair does not face other semiconductor dies and has a second edge in common with the backside surface of the first semiconductor die.

17. The manufacturing method of claim 15, wherein forming the rounded corner structure comprises forming a corner padding on an outer corner of the first semiconductor die,
the outer corner of the first semiconductor die is formed by the backside surface of the first semiconductor die and a pair of adjacent side surfaces of the first semiconductor die,
the side surfaces of the pair have a common first edge, and
each side surface of the pair does not face other semiconductor dies and has a second edge in common with the backside surface of the first semiconductor die.

18. The manufacturing method of claim 17, wherein forming the corner padding comprises:
dispensing the first material on the first semiconductor die; and
curing the first material,
wherein a viscosity of the first material is higher than a viscosity of the filling material.

19. The manufacturing method of claim 18,
wherein the filling material is dispensed to at least partially cover the pair of adjacent side surfaces of the first semiconductor die, and
the first material is dispensed so that at least a portion of the underfill is interposed between the corner padding and the pair of adjacent side surfaces of the first semiconductor die.

20. The manufacturing method of claim 18, wherein forming the encapsulant comprises:
forming an encapsulating material on the interposer covering the semiconductor dies and the cured first material; and
removing a portion of the cured first material together with a portion of the encapsulating material.

* * * * *